US009772559B2

(12) United States Patent
Cheng et al.

(10) Patent No.: US 9,772,559 B2
(45) Date of Patent: Sep. 26, 2017

(54) PATTERNED PHOTORESIST REMOVAL

(71) Applicant: Taiwan Semiconductor Manufacturing Company, Ltd., Hsin-Chu (TW)

(72) Inventors: Ya-Ling Cheng, Yilan (TW); Ching-Yu Chang, Hsin-Chu (TW); Chien-Chih Chen, Tainan (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/714,887

(22) Filed: May 18, 2015

(65) Prior Publication Data
US 2016/0342092 A1 Nov. 24, 2016

(51) Int. Cl.
*G03F 7/38* (2006.01)
*G03F 7/42* (2006.01)
*G03F 7/038* (2006.01)
*G03F 7/40* (2006.01)

(52) U.S. Cl.
CPC .............. *G03F 7/422* (2013.01); *G03F 7/038* (2013.01); *G03F 7/38* (2013.01); *G03F 7/40* (2013.01)

(58) Field of Classification Search
CPC .................................. G03F 7/40; G03F 7/42
See application file for complete search history.

(56) References Cited

U.S. PATENT DOCUMENTS

| | | | |
|---|---|---|---|
| 6,251,794 B1 * | 6/2001 | Peng | ................. H01L 21/02063 257/E21.255 |
| 8,216,767 B2 | 7/2012 | Wang et al. | |
| 8,323,870 B2 | 12/2012 | Lee et al. | |
| 8,580,117 B2 | 11/2013 | Kao et al. | |
| 8,658,344 B2 | 2/2014 | Wang et al. | |
| 8,715,919 B2 | 5/2014 | Chang et al. | |
| 8,741,551 B2 | 6/2014 | Wu et al. | |
| 2008/0129178 A1 | 6/2008 | Hudspeth et al. | |

(Continued)

FOREIGN PATENT DOCUMENTS

| | | |
|---|---|---|
| EP | 1061560 B1 | 3/2011 |
| JP | H01269941 | 10/1989 |

(Continued)

OTHER PUBLICATIONS

Office Action dated Oct. 31, 2016, Application No. KR10-2015-0167964, 18 pages.

*Primary Examiner* — Kathleen Duda
(74) *Attorney, Agent, or Firm* — Haynes and Boone, LLP

(57) ABSTRACT

Methods for performing a photolithographic process are disclosed. The methods facilitate the removal of photosensitive from a wafer after the photosensitive has been used as an etch mask. The photosensitive may be a negative tone photosensitive that undergoes a cross-linking process on exposure to electromagnetic energy. By limiting the cross-linking through a reduced post-exposure bake temperature and/or through reduced cross-linker loading, the photoresist, or at least a portion thereof, may have a reduced solvent strip resistance. Because of the reduced solvent strip resistance, a portion of the photosensitive may be removed using a solvent strip. After the solvent strip, a dry etch may be performed to remove remaining portions of the photoresist.

20 Claims, 13 Drawing Sheets

(56) References Cited

U.S. PATENT DOCUMENTS

| | | |
|---|---|---|
| 2010/0297539 A1 | 11/2010 | Gronbeck et al. |
| 2012/0219755 A1 | 8/2012 | Bae et al. |
| 2013/0323641 A1 | 12/2013 | Chang |
| 2014/0011133 A1 | 1/2014 | Liu et al. |
| 2014/0017615 A1 | 1/2014 | Chang |
| 2014/0017616 A1 | 1/2014 | Chang |
| 2014/0065843 A1 | 3/2014 | Chang et al. |
| 2014/0117563 A1 | 5/2014 | Yu et al. |
| 2014/0120459 A1 | 5/2014 | Liu et al. |
| 2014/0186773 A1 | 7/2014 | Chang |
| 2014/0255850 A1 | 9/2014 | Chang et al. |
| 2014/0272709 A1 | 9/2014 | Liu et al. |
| 2014/0272726 A1 | 9/2014 | Chang |
| 2014/0273521 A1 | 9/2014 | Wu et al. |

FOREIGN PATENT DOCUMENTS

| | | |
|---|---|---|
| JP | 2004191833 | 7/2004 |
| KR | 20120101618 | 9/2014 |

\* cited by examiner

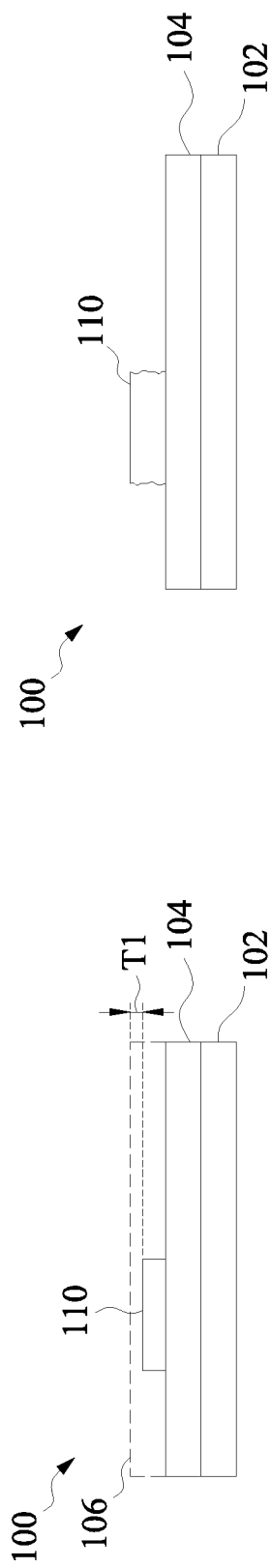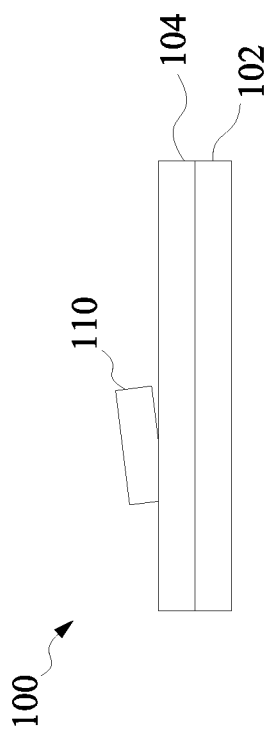

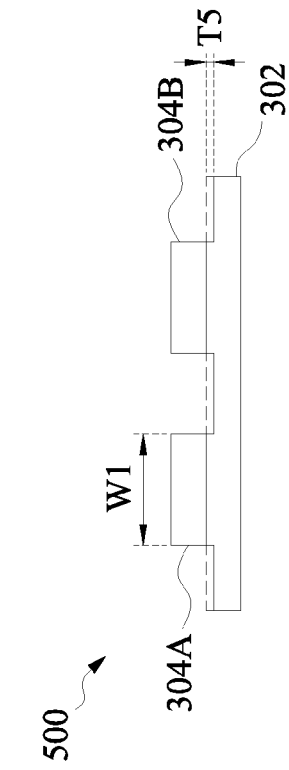
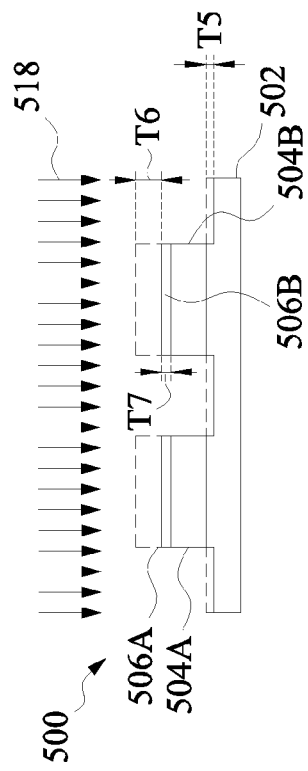

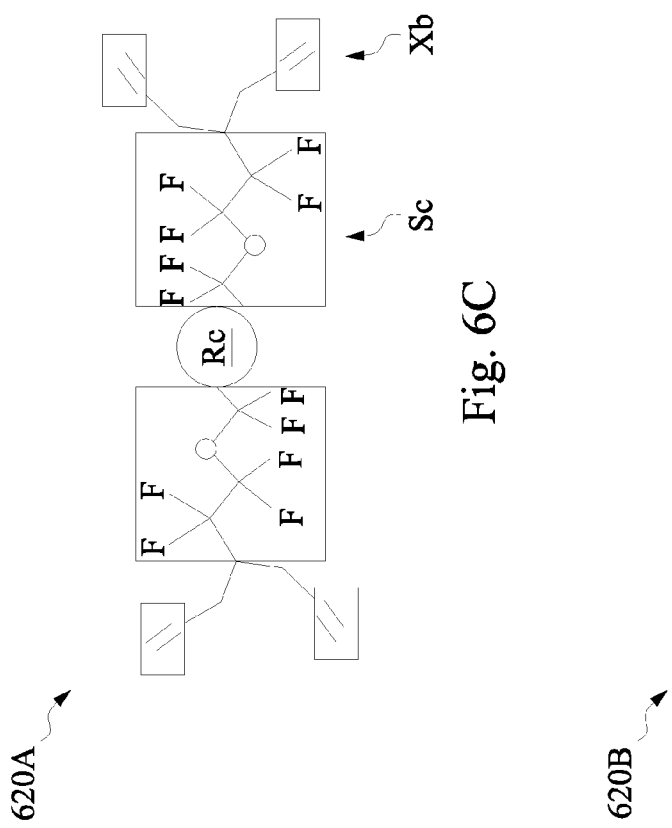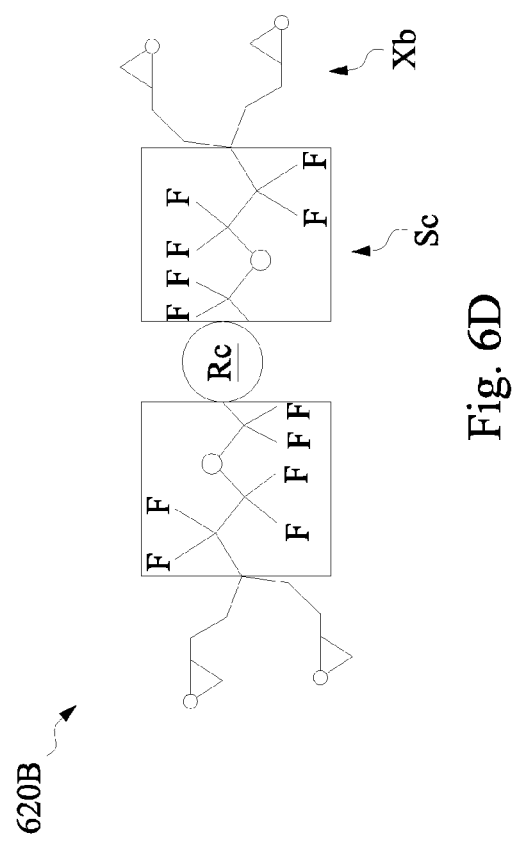
Fig. 6C
Fig. 6D

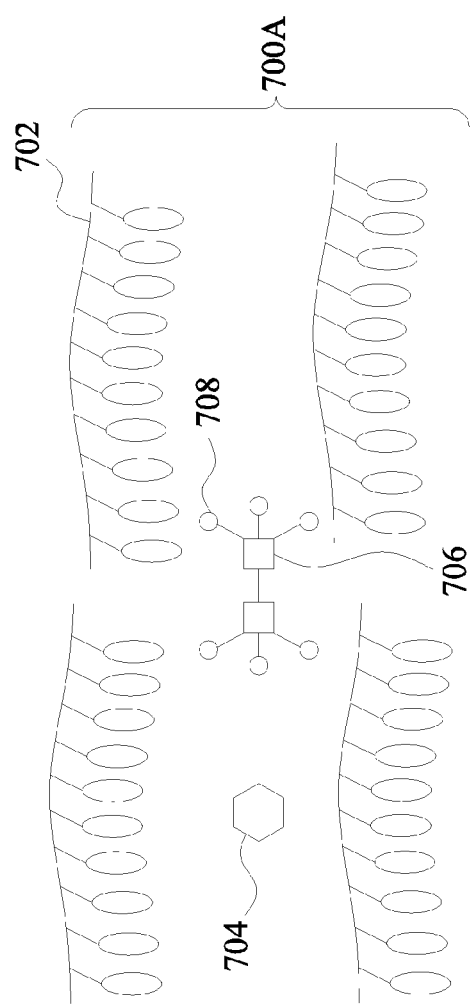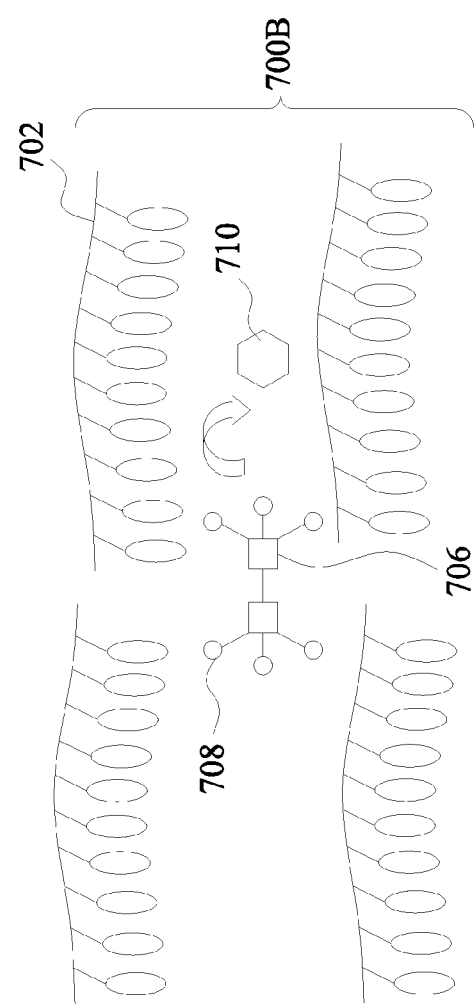
Fig. 7

PATTERNED PHOTORESIST REMOVAL

BACKGROUND

The semiconductor device industry has experienced rapid growth. In the course of device evolution, the functional density has generally increased while feature size has decreased. This scaling down process generally provides benefits by increasing production efficiency and lowering associated costs. Such scaling down has also increased the complexity of design and manufacturing these devices.

One of the many techniques used to produce semiconductor devices is photolithographic patterning or photolithography. Photolithography is a process by which a pattern produced on a photomask can be transferred to a photoreactive material layer (photoresist or PR), which when developed includes a pattern corresponding to the pattern produced on the photomask. Thereafter, the patterned photoresist layer may serve as an etch mask during an etch process to pattern the material layer underneath the photoresist layer.

As the scaling down of semiconductor devices has progressed, conventional photolithography has not proved entirely satisfactory. New techniques, such as extreme ultraviolet (EMU) photolithography, have allowed the scaling to continue, but there are still significant difficulties to be overcome. For example, providing a patterned photoresist layer with sufficient structural integrity to withstand one or more etchings may result in a patterned photoresist layer that is difficult to remove from the semiconductor device wafer in order to perform subsequent processing steps.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A, 2B, and 2C are cross-sectional views illustrating some defects that can occur as a result of a photolithography process.

FIGS. 5A, 5B, 5C, 5D, 5E, and 5F illustrate a photolithographic process according to aspects of the present disclosure.

FIGS. 6C and 6D illustrate exemplary cross-linkers that induce a gradient within a photosensitive layer according to aspects of the present disclosure.

FIG. 7 is a diagram illustrating activity in a photoresist according to aspects of the present disclosure.

DETAILED DESCRIPTION

Figure 1B:
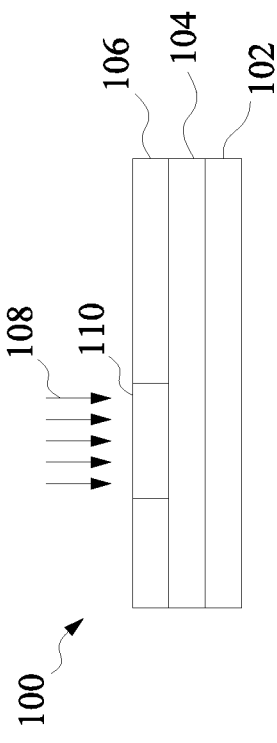
FIGS. 1A, 1B, 1C, and 1D are a cross-sectional view of semiconductor wafer undergoing a photolithography process.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

It is understood that several processing steps and/or features of a device may be only briefly described, such steps and/or features being well known to those of ordinary skill in the art. Also, additional processing steps or features can be added and certain of the following processing steps or features can be removed and/or changed while still implementing the claims. Thus, the following description should be understood to represent examples only, and are not intended to suggest that one or more steps or features is required.

It is further understood that the present disclosure refers generally to processes of photolithographic pattern formation such as may be performed to pattern a substrate and/or one or more layers formed over a substrate that is part of a semiconductor wafer. The substrates described herein may take various forms including but not limited to wafers (or portions thereof) or substrates of individual devices such as chips (e.g., fabricated on a wafer). More particularly, the present disclosure refers to the removal of photosensitive layer after an etch process. Various features may be formed on the substrate including integrated circuits including those formed by CMOS-based processes, MEMS devices, image sensors, and the like. Photolithography may be employed to pattern individual components on a plurality of layers that are combined to form one or more devices on a chip. To the extent that the patterns may be transferred into one or more layers with fidelity to a design layout, the functioning of the resulting devices may be improved. Deviations from the design layout may result in inferior or defective devices or nonfunctioning devices. Such deviations may be introduced in a variety of ways including through errors in transferring a design into a photosensitive layer, such as a photoresist layer.

Referring now to FIGS. 1A-1D, illustrated therein is a series of cross-sectional views of a wafer 100 having a substrate 102 and a material layer 104 over the substrate 102. While the material layer 104 is illustrated as being in direct contact with the substrate 102, other embodiments may include one or more additional layers that are also on the substrate 102 and situated between the substrate 102 and the illustrated material layer 104.

As illustrated, the substrate 102 is a semiconductor substrate. Here, substrate 102 includes silicon. The substrate 102 alternatively or additionally includes other elementary semiconductors, such as germanium. Embodiments of the substrate 102 may also include a compound semiconductor, such as silicon carbide, gallium arsenic, indium arsenide, and indium phosphide. Alternatively, the substrate 102 may include a non-semiconductor material such as glass, quartz, calcium fluoride, and/or other suitable material. In some embodiments, substrate 102 is a crystalline substrate and may have a particular crystallographic orientation.

As shown, material layer 104 is formed on substrate 102. The material layer 104 may be formed directly on the substrate 102 such that the material layer 104 contacts the substrate 102, or the material layer may be formed on one or more other material layers (not explicitly illustrated) situated between the material layer 104 and the substrate 102. Here, material layer 104 is a dielectric layer that includes a silicon oxide material. However, the material layer 104 may be any other material layer known to one of skill in the art of semiconductor device fabrication. For example, the material layer 104 may be formed from silicon nitride, silicon oxynitride, amorphous polysilicon, multi-crystalline silicon, a metal oxide or oxides, a high k dielectric layer such as hafnium silicate, zirconium silicate, hafnium dioxide, etc. In some embodiments, the material layer 104 may be a conductive layer such as doped polysilicon or doped silicon or a metal layer such as copper, aluminum, or gold, etc.

Figure 1D:
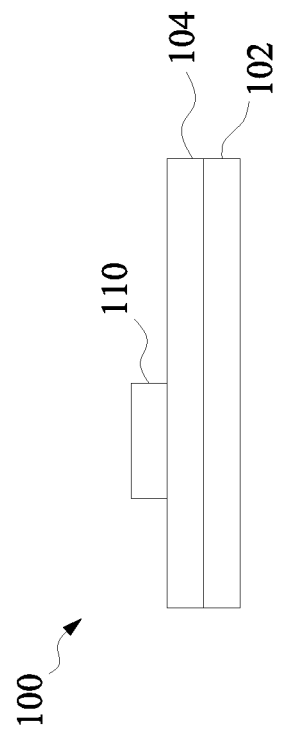
Figure 1A:
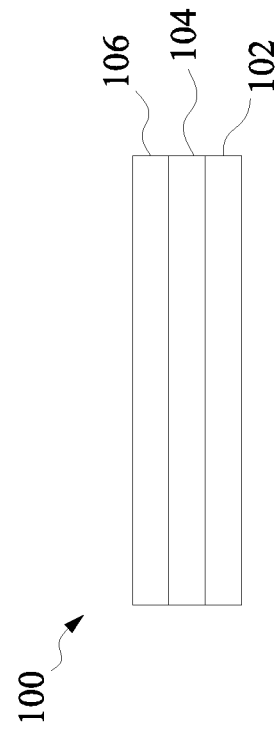
Figure 1C:
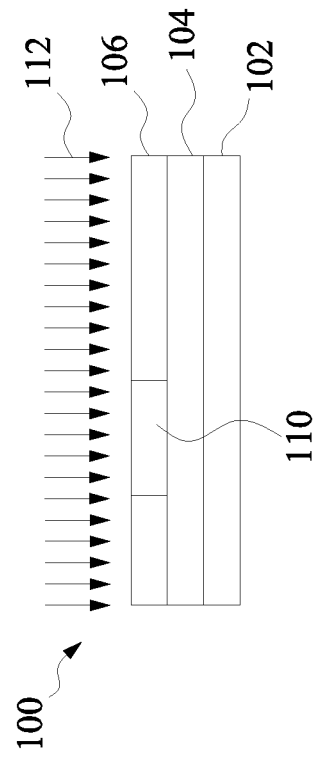

In FIG. 1A, a photoresist (or photosensitive) layer 106 is formed over the material layer 104. This may be done by a spin-on coating process. The photoresist 106 may be a positive photoresist. As shown in FIG. 1B, a radiation source provides electromagnetic energy 108 that causes a chemical change in the exposed portion 110 of the photosensitive layer 106, also referred to herein as a photoresist layer 106. Due to the exposure of the photoresist portion 110, the portion 110 undergoes an acid catalytic de-protection reaction (CAR). When the electromagnetic energy 108 is extreme ultraviolet (EMU) energy or an e-beam source, the acid yield may be low, which may require a longer duration of exposure. The longer duration of exposure may inhibit the use of this technique in high volume manufacturing situations. One approach to addressing the low sensitivity may be to increase the loading of the photo acid generator (PAGE) in the photoresist. However, this may induce rounding on the feature profiles and an undesirable top loss effect.

Traditionally, when photoresist layer 106 is a positive photoresist material, the exposed portions (e.g. Portion 110) are removed by a positive tone developer. By contrast, in FIG. 1C, a negative tone developer 112 is applied to photoresist layer 106. Unlike a positive tone developer, when used on a positive tone resist, the negative tone developer may utilize a change in polarity of the exposed portion 110 compared with the unexposed portions to remove the unexposed portions of the positive photoresist layer 106 as is shown in FIG. 1D. In FIG. 1D, the exposed portion 110 remains after application of the negative tone developer 112.

However, certain problems may arise in the context of the process illustrated in FIGS. 1A-D. As shown in FIGS. 2A-C, when the photoresist layer 106 includes an alkali aqueous soluble unit such as —OH or —COOH, application of the negative tone developer to the positive photoresist layer can result in a swelling effect in the photoresist that causes problems. As shown, if FIG. 2A, this can result in film loss. Specifically, a portion or thickness T1 of the exposed portion 110 can be removed, such that the thickness of the remaining exposed portion 110 is less than an original thickness indicated by the dashed line representing the previous profile of the photoresist layer 106. Additionally, as shown in FIG. 2B, the edges of the exposed portion 110 exhibits significant line width roughness under such circumstances Another issue is that the application of the negative tone developer to the positive photoresist layer is the weakening of the adhesion between the photoresist layer 106 and the underlying material layer 104. As shown in FIG. 2C, the exposed portion 110 is peeling away from the material layer 104 due to higher capillary attraction from the aqueous developer. In some embodiments, the aqueous developer may be tetraethylammonium hydroxide (TMAH).

When these defects are present, the fidelity of pattern transfer into the material layer 104 by an etch process is diminished. The smaller the feature size on the wafer 100, the more the errors of pattern transfer are likely to render a chip or device unsatisfactory, resulting in poor chip/device yield per wafer.

Figure 3B:
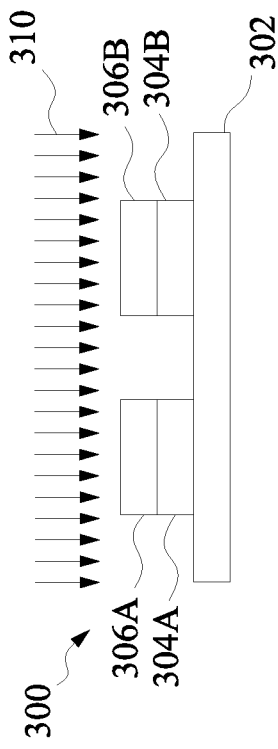
FIGS. 3A, 3B, 3C, and 3D are cross-sectional views illustrating a photolithographic process that results in feature damage.
Figure 3D:
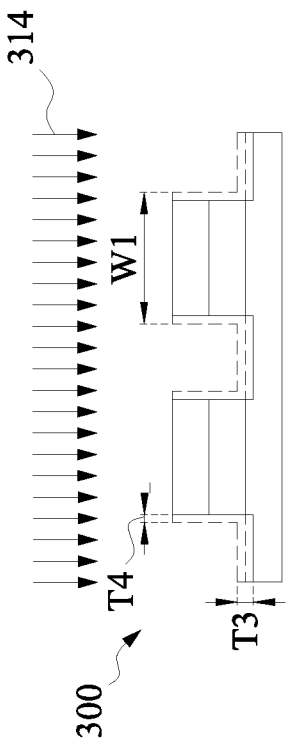
Figure 3A:
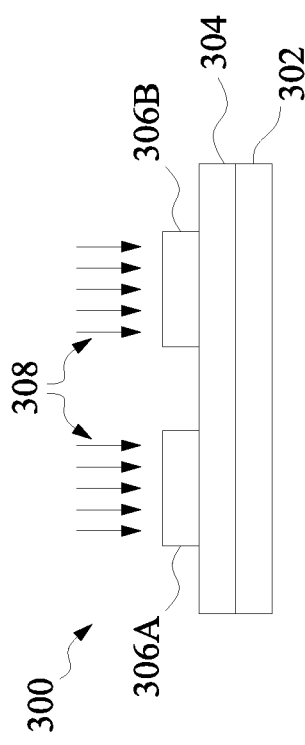
Figure 3C:
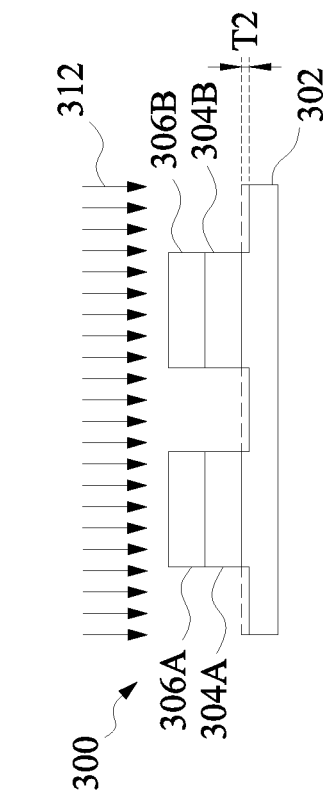

Referring now to FIGS. 3A-D, shown therein is a series of cross-sectional views of a wafer 300 undergoing photolithographic patterning. As shown in FIG. 3A, the wafer 300 includes a substrate 302, which may be similar to the substrate 102 of FIGS. 1A-D described above. The substrate 302 has a material layer 304 thereon, which may be similar to the material layer 104 described herein. As illustrated in FIG. 3A, over and directly contacting the material layer 304 are two exposed portions 306A and 306B of a photoresist layer. The two exposed portions may be defined by a photolithographic mask or photomask that results in the electromagnetic energy pattern 308, which results from the interactions of an electromagnetic energy or radiation source, such as an e-beam or EMU lamp, with a photomask. As illustrated in FIGS. 3A-C, the exposed photoresist portions 306A and 306B are formed from a photoresist layer 306 that is a negative photoresist. The negative photoresist layer 306 includes a cross-linker that is fully cross-linked by the electromagnetic energy pattern 308. In some embodiments, the fully-cross linked exposed photoresist portions 306A and 306B may be 99% cross-linked, such that 99% of the cross-linkers contains the portions 306A and 306B have been activated to cross-link with a polymer present in the photoresist layer 306. In some embodiments, more than 95% or more than 90% may be considered as fully cross-linked. In other embodiments, exposed photoresist portions that lose less than 5% or 1% or thickness after exposure to a strip solvent may be considered fully cross-linked. Conventional negative photoresists usually introduce cross-linker overloading so that a fully cross-linked photoresist layer is more easily achieve due to a higher density distribution of cross-linkers in the polymer, which is configured with cross-linker sites. For example, a conventional negative photoresist may have more than 20% loading by weight compared to the overall formulation of the photoresist.

In FIG. 3B, an etch process 310 removes the exposed portions of the material layer 304 using the photoresist portions 306A and 306B as an etch mask. The removal of the exposed portions of the material layer 304 results in the generation of material layer portions 304A and 304B corresponding to the photoresist portions 306A and 306B. In FIG. 3C, another etch process 312 is applied to the wafer 300 to etch exposed portions of the substrate 302. The etch process 312 may result in a decrease in substrate thickness as indicated by the thickness T2. In some embodiments, the etch process 310 and the etch process 312 may be performed in a single etch process such as a dry and/or wet etch. For example, a single reactive ion etch process may be performed to perform both of the etch processes 310 and 312. In some embodiments a different etch gas may be used to provide each of the processes 310 and 312, or a single etch gas may be used to provide both etch processes 310 and 312. The fully cross-linked photoresist portions 306A and 306B remain in place during the etch processes 310 and 312.

One approach to removing the negative photoresist portions 306A and 306B is illustrated in FIG. 3D as a dry etch process 314. The dry etch process removes the portions 306A and 306B, but also causes substrate damage, increasing the thickness T2 to a damaged thickness T3. Additionally, the dry etch process 314 may cause damage to the material layer portions 304A and 304B by removing material from either side thereof. A thickness T4 may be removed from either side of the material layer portions 304A and 304B. Shown in both FIGS. 3C and 3D is a dashed line representing the pre-etch height of the substrate 302 (FIG. 3C) and the pre-damage height of the substrate 302 and the pre-damage width thereof (FIG. 3D).

Figure 4:
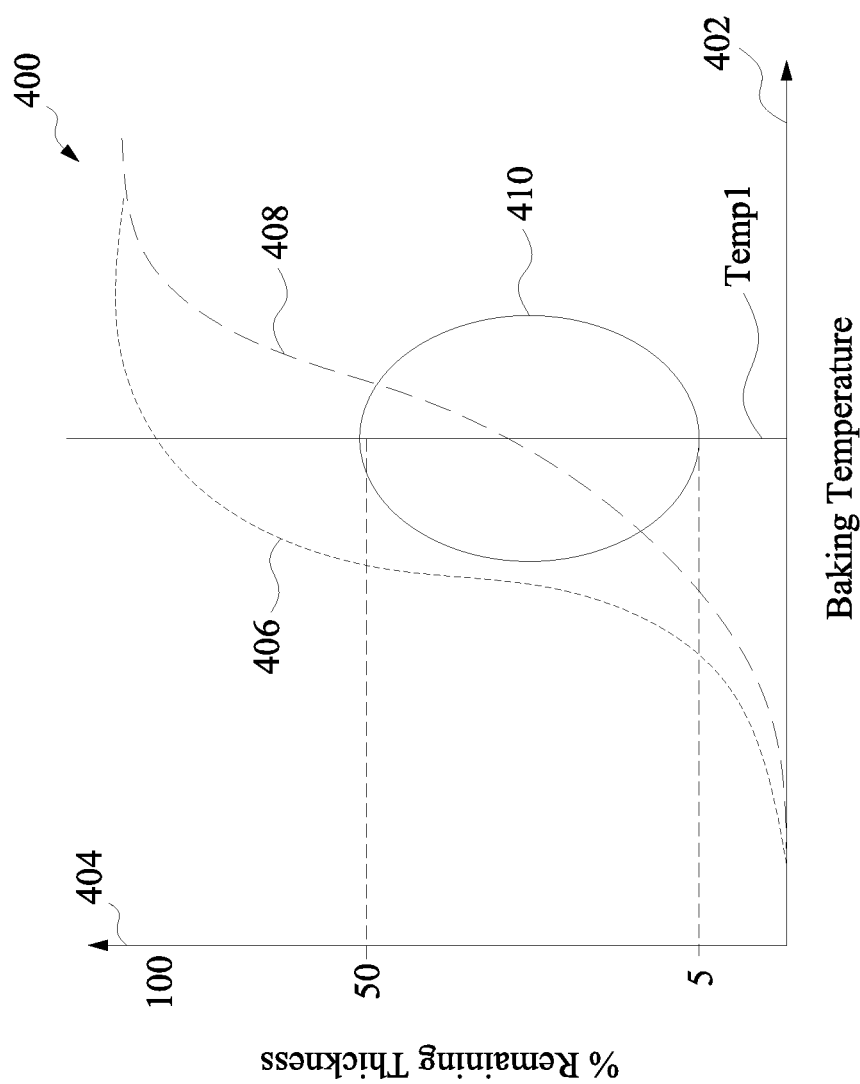
FIG. 4 is a graph illustrating a relationship between baking temperature and a percentage of remaining thickness after a solvent strip according to aspects of the present disclosure.

Referring now to FIG. 4, shown therein is a plot 400 that illustrates a response of a photoresist layer, like the photoresist layer 306 of FIGS. 3A-C, described above. The x-axis 402 of the plot 400 indicates a soft bake temperature. During photolithography, after the photoresist is deposited over a material layer, the photoresist layer is soft baked prior to exposure to electromagnetic energy. The photoresist layer may then be selectively exposed to produce chemical reactions in specific areas of the photoresist. A post-exposure bake may be performed in some embodiments prior to application of a developer to remove the exposed or unexposed portions of the photoresist layer, depending on the type of photoresist (negative or positive) and the tone of the developer (negative or positive). The post-exposure bake may trigger or further promote chemical reactions within the photoresist. For example, during the post-bake sufficient energy may be provided to initialize cross-linking acid catalyst reactions and acid labile de-protection reactions. In this way, the average molecular weight of the photoresist changes (as the cross-linking reactions form larger molecules). As illustrated in FIG. 4, the photoresist is a negative photoresist.

The y-axis 404 of the plot 400 indicates a percentage of thickness of photoresist remaining after a process. The process associated with the dashed line 406 is exposure to a strip solvent. The strip solvent may be one of propylene glycol monomethyl ether (PGME), propylene glycol monomethyl ether acetate (PGMEA), methyl butyl ketone (MBK), methyl isobutyl carbinol (MBIC), isopropyl alcohol (IPA), and gamma-butyrolactone (GBL), etc. The y-axis 404 may indicate a strip resistance of the photoresist layer. As shown in plot 400, the strip resistance (as determined by the percent of photoresist layer thickness remaining after a treatment) varies as the post-exposure baking temperature varies.

In a conventional process, a temperature "Temp1" is selected to fully cross-link the negative photoresist. This causes the conventional negative photoresist to be highly resistant to the strip solvent. The relationship between the strip resistance (as measured by a percentage of remaining thickness after the solvent strip) and the temperature for the conventional negative photoresist is illustrated by curve 406. However, when an unconventional negative photoresist is used, the same temperature achieve different results. The relationship between the strip resistance and the temperature for the negative photoresist used in embodiments described herein is represented by curve 408. As shown in FIG. 4, a conventional negative photoresist, illustrated by curve 406, becomes much more strip resistant at the same temperature Temp1 than the negative photoresist of the present disclosure does. As noted, conventional negative photoresists usually introduce cross-linker overloading so that a fully cross-linked photoresist layer is more easily achieve due to a higher density distribution of cross-linkers in the polymer, which is configured with cross-linker sites. For example, a conventional negative photoresist may have more than 20% loading by weight compared to the overall formulation of the photoresist. The negative photoresist described by curve 408 has a lower cross-linker loading. For example, the negative photoresist of curve 408 may have a cross-linker loading ranging from about 0.1% to about 10% (equivalent loading versus polymer). While the conventional negative photoresist may be "overloaded," the photoresist described by curve 408 and discussed more below in respect to FIGS. 5A-F may be "underloaded" such that full cross-linking is avoided.

As indicated by the region of interest 410, by using a lower temperature, the negative photoresist can be made less resistant to the strip solvent, such that the application of the strip solvent can result in a remaining thickness of about 5% to about 50%. For example, a temperature that ranges from about 80 degrees Celsius to about 250 degrees Celsius may result in strip solvent resistance that ranges from about 5% to about 50%. Performing a photolithography process that intentionally results in a decreased resistance of the photoresist layer to a solvent or developer may be counterintuitive because this can also result in a decrease in strength of the photoresist layer. Embodiment of a photoresists, the resistance of which is illustrated in FIG. 4 is discussed herein, particularly in connection with FIGS. 6C, 6D, 7, and 8A-B.

Figure 5B:
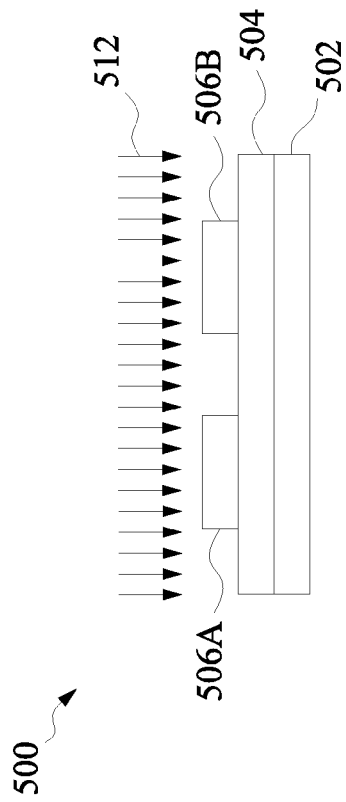
Figure 5A:
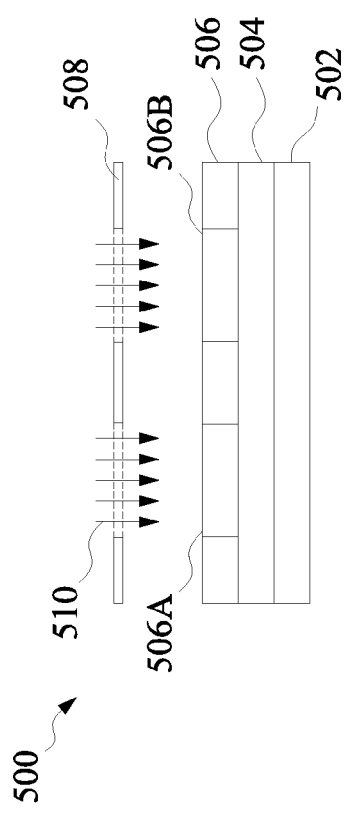

Referring now to FIGS. 5A-F, shown therein is a process of patterning a material layer on a semiconductor substrate and removing a patterned photoresist layer that may avoid and/or minimize the substrate and feature damage described above in connection with FIGS. 3A-D, while avoiding the other problems described in connection with FIGS. 2A-C. A wafer 500 is shown in FIGS. 5A-F, which includes a semiconductor substrate 502. The wafer 500 may be substantially similar to the wafers 100 and 300 described herein. In the illustrated embodiment, a material layer 504 is formed over the substrate 502. The material layer 504 may be formed directly over the substrate 502 such that the material layer 504 directly contacts the substrate 502. In other embodiments, one or more other material layers may be present between the material layer 504 and the substrate 502. The material layer 504 may include any material layer employed in semiconductor device fabrication. Thus, the material layer 504 may be an insulating material layer, a conductive material layer, a barrier layer, a capping layer, etc. FIG. 5A also illustrates a negative photosensitive or photoresist layer 506 that may be similar to the photoresist layer described above in connection with the plot 400 of FIG. 4.

Also illustrated in FIG. 5A is a photomask 508 that includes a design layout embodied as defined translucent areas and opaque areas in some embodiments, and reflective areas and absorptive areas in other embodiments. For example, the photomask 508 may be a reflective EMU photomask. An electromagnetic energy 510 is applied to the photoresist layer 506 to form exposed portions 506A and 506B. As described herein, the electromagnetic energy 510 causes chemical reactions within the photoresist layer 506 such that changes in exposed portions cause the exposed portions to be removable by a developer solution.

After to exposure to the electromagnetic energy 510, the wafer 500, with the photoresist layer 506 thereon, may undergo a post-exposure bake process. The post-exposure bake process may be performed before or after development and at a temperature ranging from about 80 degrees Celsius to about 250 degrees Celsius. When the exposed portions 506A and 506B receive the post-exposure bake treatment, the exposed portions 506A and 506B may gain a solvent strip resistance of about 5% to about 50%, as described above in connection with FIG. 4.

Referring now to FIG. 5B, shown therein is the wafer 500 as resulting after a chemical treatment 512 is applied to the wafer 500. In some embodiments, the chemical treatment 512, may be a negative tone developer such as n-butyl acetate (nBA) and may be a spray process rather than an immersion process, such that the wafer 500 is sprayed with an organic developer rather than immersed therein. In other embodiments, the wafer 500 is immersed in a vat of developer. After the chemical treatment 512, the unexposed portions of the photoresist layer 506 are removed while the exposed portions 506A and 506B remain. That is, photoresist layer 506 is negative photoresist layer being developed by a negative tone developer.

Figure 5D:
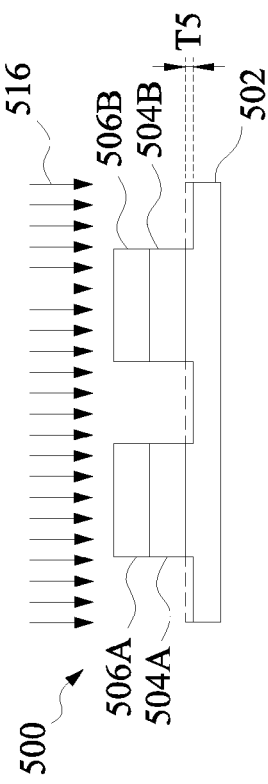
Figure 5C:
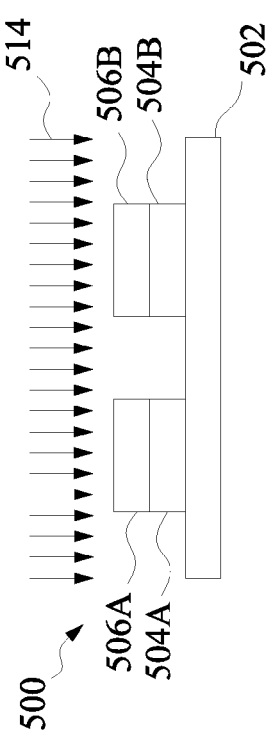

FIG. 5C illustrates the wafer 500 after a first etch process 514, which may be a wet etch process and/or a dry etch process intended to remove exposed portions of the material layer 504 resulting in the remaining portions 504A and 504B. The remaining material layer portions 504A and 504B correspond to the exposed portions 506A and 506B of the photoresist layer 506. The exposed portions 506A and 506B act as a mask layer to protect the underlying portions of the material layer 504 during an etch process in order to shape the material layer 504 according to a design layout. FIG. 5D illustrates a second etch process 516 which may be included in some embodiments in which a portion or thickness of the substrate 502 is to be removed. For example, as illustrated in FIG. 5D, a thickness T5 of the substrate 502 is removed. In some embodiments, the first and second etch processes 514 and 516 may be combined in a single etch process using a single etchant. The etchant may be provided as a solution or as a gas depending on the etch process and the associated layers or materials to be removed from the wafer 500. In some embodiments of the wafer 500 and the processing performed thereon, no material is removed from the substrate 502. This may be the case when an additional material layer is present between the material layer 504 and the substrate 502, as well as in embodiments in which the material layer 504 is formed directly on and in contact with the substrate 502.

FIG. 5E illustrates the wafer 500 after a developer or strip solvent 518 is applied to the surface of the wafer 500 as a spray or in an immersion process. As illustrated in FIG. 5E, the strip solvent 518 removes a thickness T6 from each of the photoresist portions 506A and 506B. The removal of the thickness T6 from each of the portions 506A and 506B results in a remaining thickness T7 of the portions 506A and 506B. Because of the qualities of the photoresist layer 506 and the treatment applied thereto, such as a post-exposure bake at a lower than conventional temperature and with a photoresist having a lower cross-linker loading, a majority of the thickness of the portions 506B and 506A may be removed by the strip solvent 518. In some embodiments, the thickness T6 may range from 50% to 95% of a pre-strip thickness of the portions 506A and 506B. In other words, the thickness T7 (described herein as a strip resistance) may range from 5% to 50% of the pre-strip thickness of the portions 506A and 506B. Because the thickness of the photoresist portions 506A and 506B is decreased, a dry etch process may be performed for a less-than-conventional duration. This prevents damage to the substrate 502 and/or to other underlying material layers. Additionally, as shown in FIG. 5F, the width W1 of the material layer portions 504A and 504B may not be altered undesirably by the dry etch.

Figure 6B:
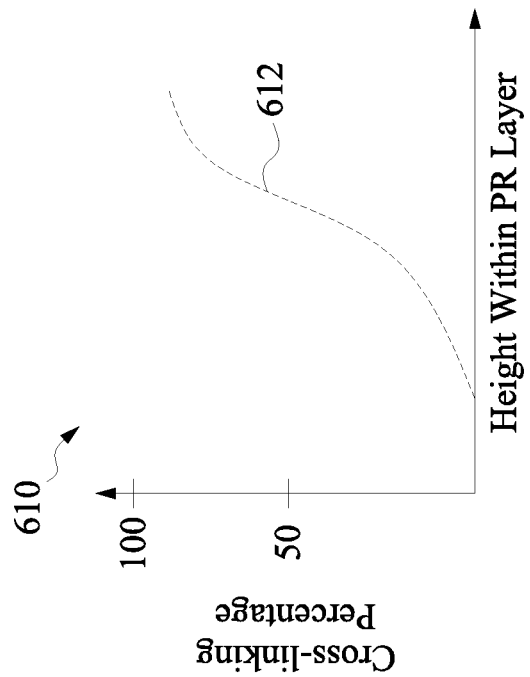
FIGS. 6A and 6B illustrate a cross-linking gradient induced within a photosensitive layer according to aspects of the present disclosure.
Figure 6A:
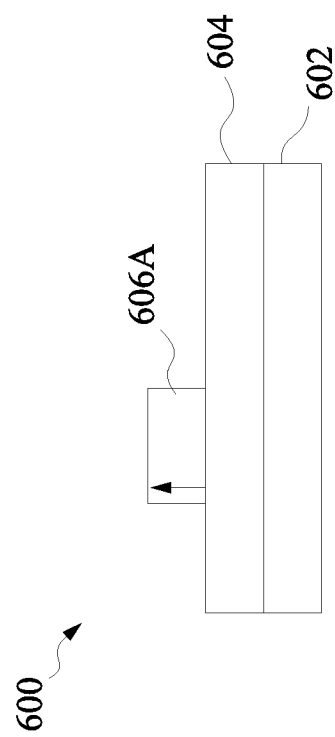

FIG. 6A is a cross-sectional view of a wafer 600 that includes a patterned portion 606A of a photoresist layer according to aspects of the present disclosure. The wafer 600 includes a substrate 602 and a material layer 604 formed thereover. Portions of the photoresist layer have been removed as shown. An exposed portion 606A remains on the material layer 604. As illustrated, the photoresist portions 606A has a non-uniform distribution of cross-linkers that varies with the height or thickness of the portion 606A, such that when activated by electromagnetic energy, there is more cross-linking closer to upper levels of the portion 606A than there is closer to the lower levels of the portions 606A. FIG. 6B illustrates a plot 610 that demonstrates an exemplary relationship between the height within the portion 606A and the percentage of activated cross-linkers therein. The photoresist is such that the exposed portions of the photoresist layer have a cross-linking gradient between a bottom surface of the exposed portions and a top surface of the exposed portions. This relationship is indicated by the dotted line 612. As illustrated in FIG. 6B, there is less than 50% cross-linker activation at approximate 66% of the height of the photoresist portion 606A. The photoresist of the photoresist portion 606A may be similar to the photoresists 700, 800A, and 800B, described below. The gradient of cross-linking in the photoresist portion 606A may be generated by the inclusion of a floating agent in the cross-linkers, using a floating polymer resin, or a floating catalyst. Such floating cross-linkers, floating polymer resins, and/or floating catalysts are described in more detail in U.S. patent application Ser. No. 14/056,737, filed Oct. 17, 2013 and entitled "Anti-Reflective Layer and Method," which claims the benefit of U.S. Provisional Application Ser. No. 61/777,782, filed on Mar. 12, 2013 and also entitled "Anti-Reflective Layer and Method," both of which are incorporated by reference herein in their entirety.

FIGS. 6C and 6D show exemplary cross-linkers 620A and 620B may be included in a photoresist in order to generate a cross-linking gradient, such as the gradient illustrated in the plot 610 of FIG. 6B. As illustrated, the cross-linkers 620A and 620B are blended-type cross-linkers, such that they are blended in the photoresist. In some embodiments, similar cross-linkers may be bonded to a polymer included in the photoresist. As illustrated, the cross-linkers 620A and 620B have a structure $Xb_z$-Sc-Rc-Sc-$Xb_z$. In bonded embodiments, the structure may be $Xb_z$-Sc-Rc-, in which the Rc is also bonded to the polymer chain.

In FIGS. 6C and 6D, the Rc may be hydrogen, halide, aromatic carbon ring, saturated, unsaturated, straight, branched or cyclic alkyl, alkoxyl, fluoroalkyl, fluoroalkoxyl, carbonyl, hydroxyl, carboxylic, ester, ether, amide, or amine with a carbon chain 1 to 20 atoms long. Sc may be hydrogen, halide, aromatic carbon ring, saturated, unsaturated, straight, branched or cyclic alkyl, alkoxyl, fluoroalkyl, fluoroalkoxyl, carbonyl, hydroxyl, carboxylic, ester, ether, amide, or amine with a carbon chain ranging from 0 to 12 atoms in length. The Sc may be a floating agent included in the cross-linker 620A or 620B so that the cross-linker 620A or 620B "floats" or rises within the photoresist 606 to generate a concentration gradient of cross-linkers and cross-linking therein, in some embodiments. Xb may include saturated, unsaturated, straight, branched or cyclic alkyl, alkoxyl, fluoroalkyl, fluoroalkoxyl, carbonyl, hydroxyl, carboxylic, ester, ether, amide, amine, imine, imide, nitrate, nitrile, en, epoxy, or a thiol functional group with a carbon chain having 1 to 12 atoms therein. z is 4 in some embodiments, and more than 4 in other embodiments. For example, z may be 6 in some embodiments, as illustrated in FIG. 7, which is described in more detail below.

Referring now to FIG. 7, shown therein is a diagrammatic view of the photoresist 700 that may be used to provide the photoresist 506 of FIGS. 5A-F. The photoresist 700A of FIG. 7 illustrates the photoresist layer 700 prior to the application of a treatment and prior to exposure to electromagnetic energy. As illustrated in FIG. 7, the photoresist 700A includes polymers 702. The polymer 702 includes a chain having at least some cross-linker sites, which are atoms or molecules that can bind to a cross-linker. The photoresist 700A also includes a photo acid generator (PAGE) 704 and the cross-linker 706. In the depicted embodiment, the cross-linker 706 includes six cross-linker sites. Some embodiments include four cross-linker sites, while yet other embodiments include five or more cross-linker sites. Some embodiments of the photoresist 700A may additionally include a quencher and/or additional components.

The photoresist 700B illustrates the photoresist layer 700 after the treatment and after exposure to the electromagnetic energy, which allowed the PAGE 704 to produce acid 710. This may result in an acid catalytic de-protection reaction and a cross-linking reaction, such that one or more sites 708 of the cross-linker 706 bond with cross-linker sites included in the polymers 702. In this way, the polymers 702 are bound together increasing the molecular weight of the photoresist 700B compared with the photoresist 700A. Additionally, the polarity of the photoresist 700A is changed by the electromagnetic energy and induced chemical reaction such that the photoresist 700B is polar, rather than non-polar. As illustrated in FIG. 7, the photoresist 700 is a blended photoresist, such that the cross-linkers are blended together in solution with the polymer.

Figure 8A:
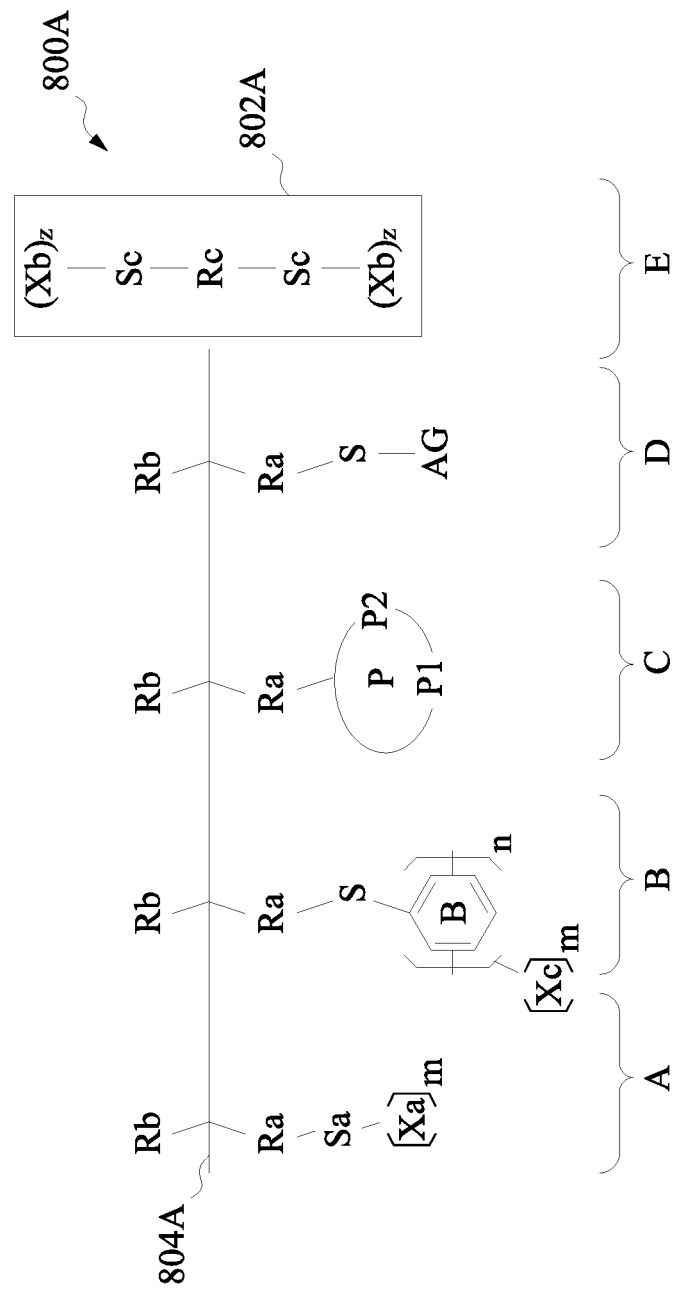
FIG. 8A illustrates a photoresist including a blended cross-linker according to aspects of the present disclosure.
Figure 8B:
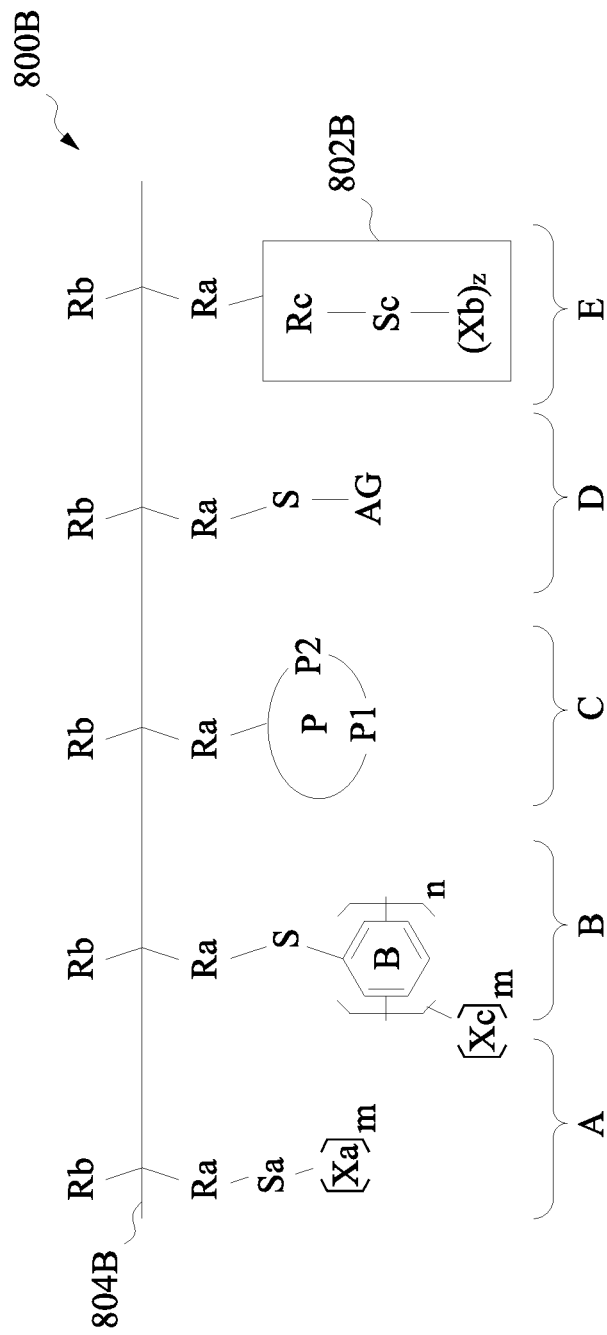
FIG. 8B illustrates a photoresist including a bonded cross-linker according to aspects of the present disclosure.

FIGS. 8A and 8B provide a chemical structure of some embodiments of the photoresist 700, that may be used to provide the photoresist 506 of FIGS. 5A-F. In particular, FIG. 8A illustrates a blended photoresist 800A, which is similar to the photoresist 700 of FIG. 7. Rather than include the cross-linker bonded to the polymer, the cross-linker 802A is provided in solution with the polymer 804A. Some embodiments of the many different chemical components of the photoresist 800A are described below.

In the photoresist 800A, Rb may be bonded to a carbon chain and may be hydrogen or $CH_3$. Ra may also be bonded directly to the carbon chain and each Ra may independently be one of saturated, unsaturated, straight, branched or cyclic alkyl, alkoxyl, fluoroalkyl, fluoroalkoxyl, carbonyl, hydroxyl, carboxylic, ester, ether, amide, amine and may include a carbon chain having 1 to 12 atoms therein. Each Sa may independently include a saturated, unsaturated, straight, branched or cyclic alkyl a alkoxyl, fluoroalkyl, fluoroalkoxyl, carbonyl, hydroxyl and may include a chain carbon having 1 to 12 atoms therein. B may be an aromatic carbon ring, such as benzene, naphthalene or anthracene, wherein n ranges from 1 to 6. Xa may include hydrogen, halide, saturated, unsaturated, straight, branched or cyclic alkyl alkoxyl, fluoroalkyl, fluoroalkoxyl, carbonyl, hydroxyl, carboxylic, ester, ether, amide, amine, imine, imide, nitrate, nitrile, or en group and may include a carbon chain having 1 to 12 atoms. Xa may be repeated m times, wherein m ranges from 1 to 12. In some embodiments, Xa may further include a hydroxyl group, epoxy, or a compound R'OR, R'OOR, R'OSOOR, RX, in which R and R' is hydrogen, halide, saturated, unsaturated, straight, branched or cyclic alkyl, alkoxyl, fluoroalkyl, fluoroalkoxyl, carbonyl, or hydroxyl with a chain carbon 1 to 12 atoms in length, and wherein X is halide.

In the photoresist 800A, Xc may be one of hydrogen, halide, saturated, unsaturated, straight, branched or cyclic alkyl, alkoxyl, fluoroalkyl, fluoroalkoxyl, carbonyl, hydroxyl, carboxylic, ester, ether, amide, amine, imine, imide, nitrate, nitrile, or en group with a chain carbon ranging from 1 to 12 atoms in length. The P of photoresist 800A may be a cyclic carbon ring in two or three-dimensions, or may include saturated, unsaturated, straight, branched or cyclic alkyl, alkoxyl, carbonyl, or hydroxyl with a chain carbon ranging from 1 to 6 atoms in length. In some embodiments, P is gamma-butyrolactone (GBL). In some embodiments, P1 and P2 may independently be alkoxyl, carbonyl or hydroxyl groups.

In the cross-linker 802A, the Rc may be hydrogen, halide, aromatic carbon ring, saturated, unsaturated, straight, branched or cyclic alkyl, alkoxyl, fluoroalkyl, fluoroalkoxyl, carbonyl, hydroxyl, carboxylic, ester, ether, amide, or amine with a carbon chain 1 to 20 atoms long. Sc may be hydrogen, halide, aromatic carbon ring, saturated, unsaturated, straight, branched or cyclic alkyl, alkoxyl, fluoroalkyl, fluoroalkoxyl, carbonyl, hydroxyl, carboxylic, ester, ether, amide, or amine with a carbon chain ranging from 0 to 12 atoms in length. The Sc may be a floating agent included in the cross-linker 802A so that the cross-linker 802A "floats" or rises within the photoresist 800A to generate a concentration gradient of cross-linkers and cross-linking therein, in some embodiments. Xb may include saturated, unsaturated, straight, branched or cyclic alkyl, alkoxyl, fluoroalkyl, fluoroalkoxyl, carbonyl, hydroxyl, carboxylic, ester, ether, amide, amine, imine, imide, nitrate, nitrile, or a thiol functional group with a carbon chain having 1 to 12 atoms therein. z is 4 in some embodiments, and more than 4 in other embodiments. For example, z may be 6 in some embodiments, as illustrated in FIG. 7. Xb may also be one of —$NH_2$, —OH, —SH, —COOH, —COH, —COR, anhydride, epoxy group, or en group.

S may include saturated, unsaturated, straight, branched or cyclic alkyl, alkoxyl, fluoroalkyl, fluoroalkoxyl, benzene, carbonyl, or hydroxyl with a carbon chain ranging from 0 to 12 atoms in length. AG may include an aromatic ring, such as a two-dimensional or three-dimensional carbon ring, hydrogen, halide, saturated, unsaturated, straight, branched cyclic alkyl, alkoxyl, fluoroalkyl, fluoroalkoxyl, carbonyl, hydroxyl, carboxylic, ester, ether, hydroxyl, amide, amine, imine, imide, nitrate, nitrile, or en group with a chain carbon having 1 to 16 atoms.

Embodiments of the photoresist 800A of FIG. 8A may further include at least one PAGE, which may be a diazonium salt, phosphonium salt, sulfonium salt, iodonium salt, imide sulfonate, oxime sulfonate, diazodisulfone, disulfone, or o-nitrobenzyl sulfonate, etc. Embodiments of the photoresist 800A may also include at least one quencher. The quencher may be tetrabutylammonium hydroxide, collidine, analine, or dimethlyaminopyridine, etc.

In the photoresist 800A, the loading of A ranges from about 20% to about 70%, the loading of B ranges from about 20% to about 70%, the loading of C ranges from about 20% to about 70%, and the loading of D ranges from about 30% to about 50%, based on polymerization. The loading of E (the cross-linker) ranges from about 0.1% to about 10%, and the equivalent loading may depend on the number of cross-linker sites on each cross-linker.

FIG. 8B illustrates a molecular model of a photoresist 800B, which includes a bonded cross-linker 802B. The molecular model of photoresist 800B illustrates the subcomponents of a polymer included in the resist. The photoresist 800B is similar to the photoresist 800A except as noted herein. Photoresist 800B differs from photoresist 800A in that the cross-linker 802B is bonded to the backbone 804B. The equivalent loading of subcomponents A, B, C, D, and E may be substantially the same for photoresist 800B as described herein for photoresist 800A. For example, the cross-linker 802B has a loading of about 0.1% to about 10% in photoresist 800B, in some embodiments.

Figure 9:
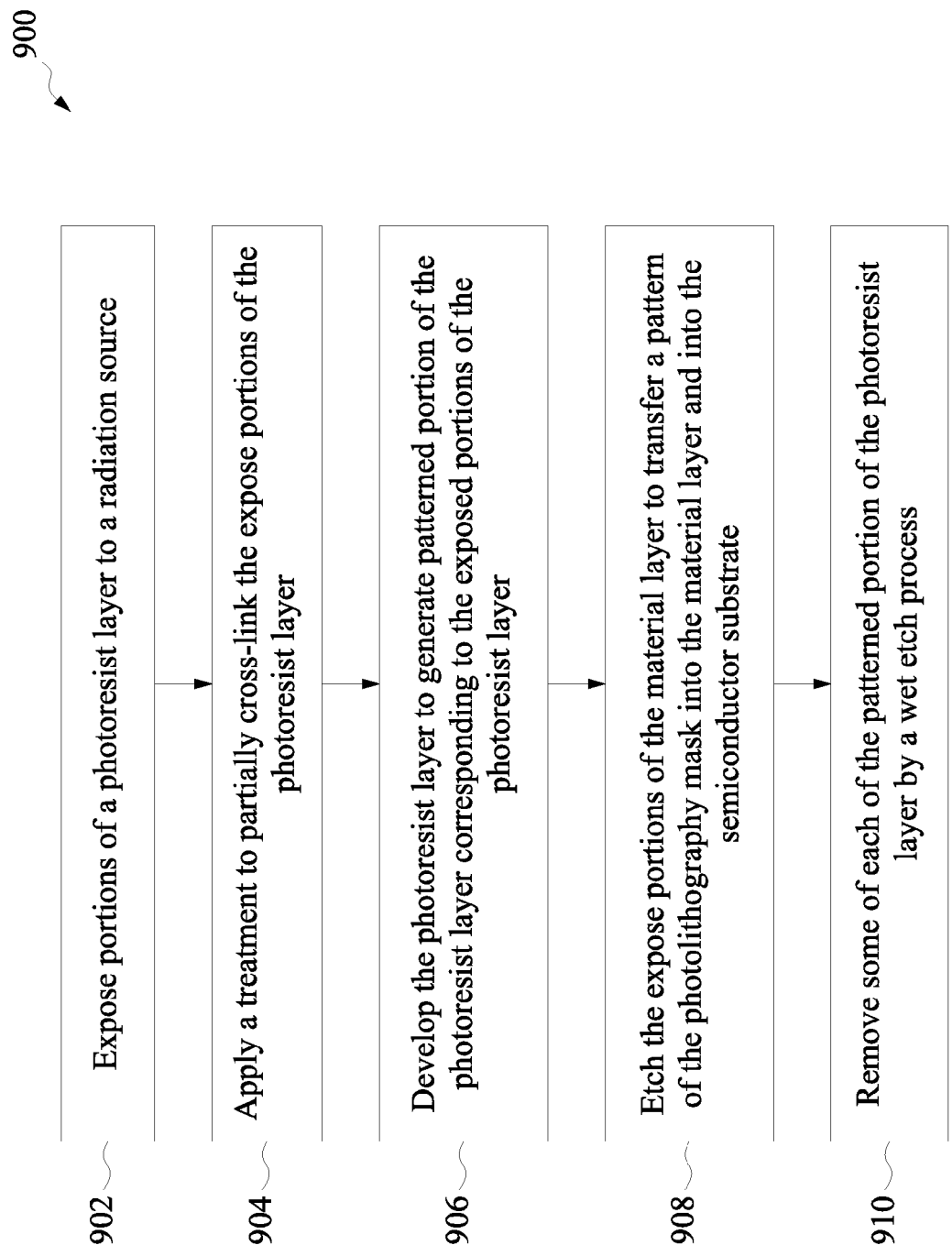
FIG. 9 is a flowchart of a method of performing a photolithographic pattern formation process and for removing a photoresist feature thereafter according to aspects of the present disclosure.

Referring now to FIG. 9, illustrated is a method 900 of performing a photolithographic pattern formation process using partially cross-linked photoresist features. As understood herein, partial cross-linking of the exposed portions of a photoresist layer results from deliberate treatments and deliberate formulations of photoresist. As illustrated, the method 900 includes a plurality of enumerated process steps which may be used to produce the wafer 500 as seen in FIGS. 5A-F. Embodiments of the method 900 may include additional processes, steps, or operations before, after, in between, or as part of any of the enumerated steps. The process steps may be performed in a semiconductor device fabrication plant that includes a plurality of fabrication tools to deposit material layers of various kinds and to pattern photoresist layers and etch deposited material layers to form semiconductor devices or chips on semiconductor wafers.

As illustrated in FIG. 9, the method 900 may begin in step 902 in which portions of a photoresist layer are exposed to a radiation source. For example, a photomask, like the photomask 508 of FIG. 5A, may be used to reflect or otherwise transmit electromagnetic energy to chemically alter the exposed portions of the photoresist layer like the portions 506A and 506B as seen in FIGS. 5A-D. The electromagnetic energy may be extreme ultraviolet (EMU) light or e-beam radiation, in some embodiments. The photoresist may be similar to the photoresists described in relation to FIGS. 7, 8A, and 8B and elsewhere herein. In some embodiments, the photoresist may include a floating agent in a cross-linker of the photoresist. For example, the photoresist may include a loading of the cross-linker that is less than 10% of the photoresist by molecular weight. The photoresist may include a loading of the cross-linker that is lower than in a conventional photoresist. In step 904, the treatment is applied to facilitate partial cross-linking within the exposed portions of the photoresist layer. In some embodiments, the treatment is a post-exposure, pre-development bake. As illustrated in plot 400 of FIG. 4 and as described herein, the bake may be performed at a lower than conventional temperature. For example, the bake may be performed at a temperature ranging from about 80 degrees Celsius to about 250 degrees Celsius. The combination of the low cross-linker loading photoresist and the applied treatment may result in partial cross-linking within the exposed portions. The partial cross linking may produce a decreased solvent strip resistance in the photoresist layer.

At step 906, the photoresist layer is developed to generate patterned portions of the photoresist layer corresponding to the exposed portions of the photoresist layer. The photoresist layer may be developed by an organic developer such as those described herein. After the photoresist layer is developed to generate patterned portions, the exposed portions of the underlying material layer may be etched to transfer a pattern of the photolithography mask and to the material layer, at step 908. In some embodiments of step 908, the pattern of the photolithography mask may be transferred into the semiconductor substrate by an additional etch process or by the same etch process in which the material layer is patterned. The etch process or etch processes may be a wet etch, a dry etch, and/or a combination thereof. For example, a dry etch using an etch gas may be used in step 908 to etch the exposed portions of the material layer. In some embodiments, the same etch process is continued to etch a portion of the substrate to remove a desired thickness thereof, like the thickness T5 shown removed from the substrate 502 in FIG. 5D. In some embodiments, a first etch process is performed to remove exposed portions of the material layer while a second etch process is performed to remove a desired thickness from the substrate. The first and second etch processes may be different processes or may be the same processes. The first and second etch processes may also be performed in a single etch chamber or in different etch chambers.

At step 910, an amount of each of the patterned portions of the photoresist layer is removed by a wet etch process. For example, as seen in FIG. 5E, a solvent strip may be applied by immersion or spray onto the wafer 500 to remove thickness T6 from the portions 506A and 506B. The solvent strip may be any solvent strip described herein or another known to those of skill in the art. For example, the strip solvent may be one of PGME, PGMEA, MBK, MBIC, IPA, and GBL, etc. In some embodiments, the developer used in step 906 may also remove some of the thickness of the exposed portions of the photoresist layer. The thickness removed from the patterned portions of photoresist may range from about 50% to about 95%. After the wet etch process removes some of each of the patterned portions of photoresist, a dry etch process may be performed to remove the remainder of the exposed portions of the photoresist layer as seen in FIGS. 5E and 5F. In conventional photolithographic processes with conventional photoresist, the strip solvent resistance of the fully cross-linked photoresist (e.g. more than 95% cross-linked) may be close to 100%, such that a wet etch to remove the patterned portions of the photoresist after etching the material layer may be ineffective or impractical in a high-volume semiconductor manufacturing environment.

In some embodiments, in which the photoresist layer has a cross-linker/cross-linking gradient as seen in FIGS. 6A and 6B and described herein, a dry etch may be performed prior to application of the strip solvent. This may be done to remove the more etch resistant upper portion of the photoresist layer including the cross-linking gradient before employing the wet etch process to remove the remaining portions that includes relatively fewer cross-linked polymers.

Figure 10:
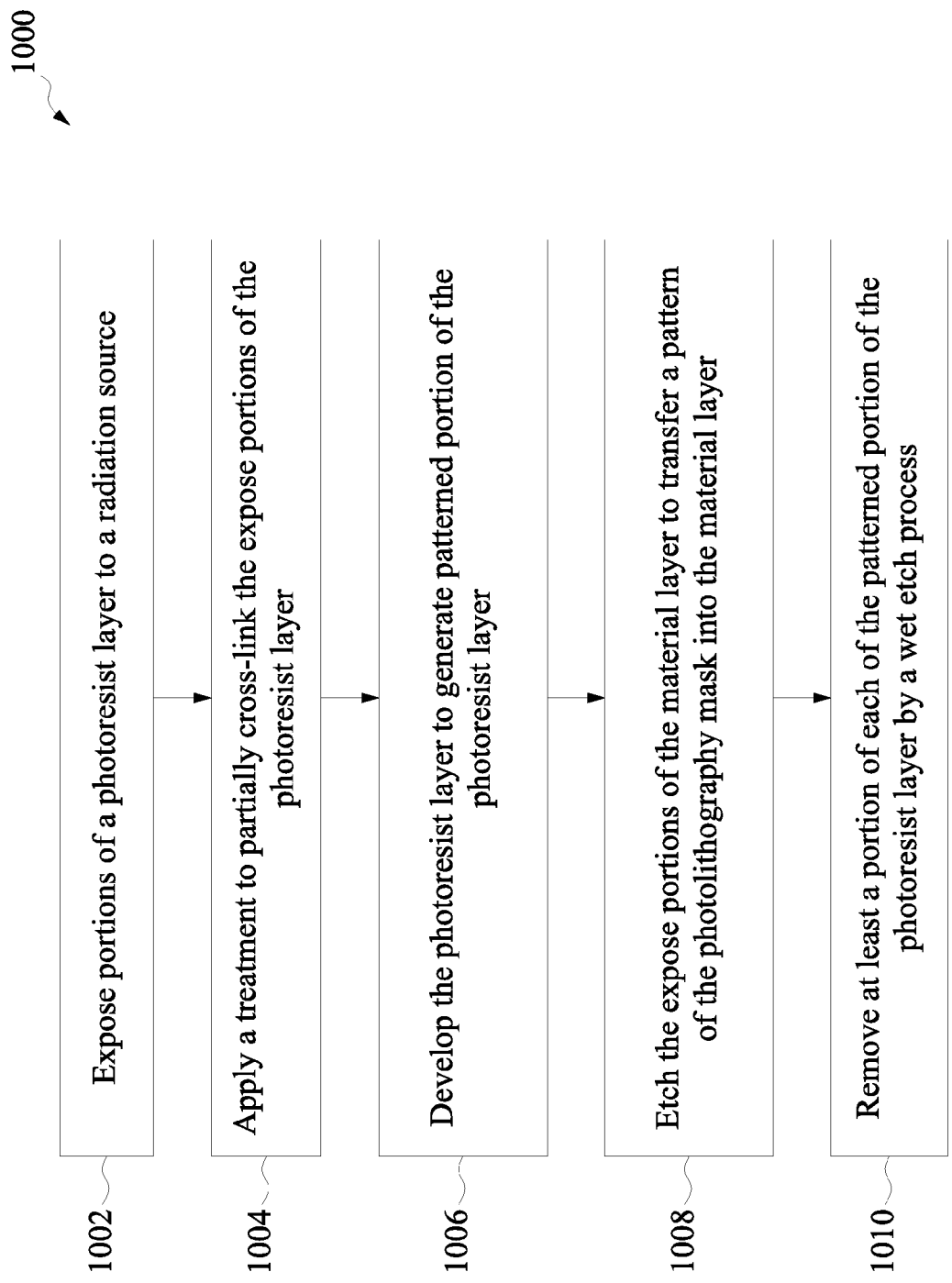
FIG. 10 is a flowchart of another method of performing a photolithographic pattern formation process and for removing a photoresist feature thereafter according to aspects of the present disclosure.

Referring now to FIG. 10, illustrated therein is a method 1000 of performing a photolithographic pattern formation process using partially cross-linked photoresist features. Like FIG. 9, FIG. 10 illustrates a flowchart of a method that includes a plurality of enumerated process steps which may be used to produce the wafer 500 as seen in FIGS. 5A-F. Embodiments of the method 1000 may include additional processes, steps, or operations before, after, in between, or as part of any of the enumerated steps. The method 1000 may be performed using substantially the same semiconductor fabrication systems and process as described in regard to method 900. Additionally, some of the steps or processes involved in the method 1000 are similar to those described above in connection with method 900.

As illustrated in FIG. 10, the method 1000 may begin in step 1002 in which portions of a photoresist layer are exposed to a radiation source. For example, a photomask, like the photomask 508 of FIG. 5A, may be used to reflect or otherwise transmit electromagnetic energy to chemically alter the exposed portions of the photoresist layer like the portions 506A and 506B as seen in FIGS. 5A-5E. The photoresist may be similar to the photoresists described relation to FIGS. 7, 8A, and 8B and elsewhere herein. In some embodiments, the photoresist may include a floating agent in a cross-linker of the photoresist. For example, the photoresist may include a loading of the cross-linker that is less than 10% of the photoresist by molecular weight.

In step 1004, a treatment is applied to facilitate partial cross-linking within the exposed portions of the photoresist layer. In some embodiments, the treatment is a post-exposure, pre-development bake. The bake may be performed at a temperature ranging from about 80 degrees Celsius to about 250 degrees Celsius. The combination of the low cross-linker loading photoresist and the applied treatment may result in partial cross-linking within the exposed portions. The partial cross-linking may produce a decreased solvent strip resistance in the photoresist layer.

At step 1006, the photoresist layer is developed to generate patterned portions of the photoresist layer corresponding to the exposed portions of the photoresist layer. The photoresist layer may be developed by an organic developer such as those described herein. After the photoresist layer is developed to generate patterned portions, the exposed portions of the underlying material layer may be etched to transfer a pattern of the photolithography mask and to the material layer, at step 1008.

At step 1010, some of the patterned portions of the photoresist layer are removed by a wet etch process. For example, as seen in FIG. 5E, a solvent strip may be applied by immersion or spray onto the wafer 500 to remove thickness T6 from the portions 506A and 506B. The solvent strip may be any solvent strip described herein or another known to those of skill in the art. For example, the strip solvent may be one of PGME, PGMEA, MBK, MBIC, IPA, and GBL, etc. The thickness removed from the patterned portions of photoresist may range from about 50% to about 95% depending on the bake temperature and the cross-linker loading. After the wet etch process removes some of each of the patterned portions of photoresist, a dry etch process may be performed to remove the remainder of the exposed portions of the photoresist layer as seen in FIGS. 5E and 5F. In some embodiments, in which the photoresist layer has a cross-linker/cross-linking gradient as seen in FIGS. 6A and 6B and described herein, a dry etch may be performed prior to application of the strip solvent. This may be done to remove the more etch resistant upper portion of the photoresist layer including the cross-linking gradient before employing the wet etch process to remove the remaining portions that includes relatively fewer cross-linked polymers.

Embodiments of the present disclosure may facilitate the removal of photoresist from a wafer after the photoresist has been used as an etch mask. The photoresist may be a negative tone photoresist that undergoes a cross-linking process on exposure to electromagnetic energy. By limiting the cross-linking through a reduced bake temperature and through reduced cross-linker loading, the photoresist, or at least a portion thereof, may have a reduced solvent strip resistance. Because of the reduced solvent strip resistance, a portion of the photoresist (ranging from 50% to 95%) may be removed using a solvent strip. Thereafter a dry etch may be performed for a shorter duration such that less damage is done to the underlying material layer or substrate and to the width of the features being patterned.

One general aspect of the present disclosure includes a method of patterning a semiconductor substrate. Embodiments of the method may include exposing portions of a photoresist layer to a radiation source, where the photoresist layer is disposed over a material layer and where the portions are defined by a photolithography mask, the material layer being formed over the semiconductor substrate, and applying a treatment to promote partially cross-linking in the exposed portions of the photoresist layer. The method may further include developing the photoresist layer to generate patterned portions of the photoresist layer corresponding to the exposed portions of the photoresist layer, etching the exposed portions of the material layer to transfer a pattern of the photolithography mask into the material layer and into the semiconductor substrate, and removing at least a portion of each of the patterned portions of the photoresist layer by a wet etch process.

Another general aspect of the present disclosure includes a method of patterning a material layer in a semiconductor fabrication process. The method may include exposing portions of a photoresist layer to a radiation source, where the photoresist layer is disposed over a material layer and where the portions are defined by a photolithography mask, and applying a treatment to partially cross-link the exposed portions of the photoresist layer. The method may further include developing the photoresist layer to generate patterned portions of the photoresist layer corresponding to the exposed portions of the photoresist layer, etching the exposed portions of the material layer to transfer a pattern of the photolithography mask into the material layer, and removing at least a portion of each of the patterned portions of the photoresist layer by a wet etch process.

Yet another general aspect of the present disclosure includes a method of patterning a material layer on a semiconductor substrate. Embodiments of the method may include applying a treatment that partially cross-links polymers in exposed portions of a photoresist layer such that the exposed portions of the photoresist layer have a cross-linking gradient between a bottom surface of the exposed portions and a top surface of the exposed portions and developing the photoresist layer to generate patterned portions of the photoresist layer corresponding to the exposed portions of the photoresist layer and to expose portions of an underlying material layer. The embodiments of the method may further include etching exposed portions of the material layer to transfer a pattern of the patterns portions of the photoresist layer into the material layer; and removing at least a portion of each of the patterned portions of the photoresist layer by a wet etch process.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims.

What is claimed is:

1. A method of patterning a semiconductor substrate, the method comprising:
exposing portions of a photosensitive layer to a radiation source, wherein the photosensitive layer is disposed over a material layer and wherein the portions are defined by a photolithography mask, the material layer being formed over the semiconductor substrate;
applying a treatment that partially cross-links the exposed portions of the photosensitive layer;

developing the photosensitive layer to generate patterned portions of the photosensitive layer corresponding to the exposed portions of the photosensitive layer;

etching the exposed portions of the material layer to transfer a pattern of the photolithography mask into the material layer and into the semiconductor substrate; and removing at least a portion of each of the patterned portions of the photosensitive layer by a wet etch process.

2. The method of claim 1, wherein the wet etch process comprises applying a strip solvent to the patterned portions of the photosensitive layer, the strip solvent removing most of a thickness of the patterned portions of the photosensitive layer.

3. The method of claim 2, further comprising performing a dry etch process that removes a remaining thickness of the patterned portions of the photosensitive layer.

4. The method of claim 1, wherein applying the treatment comprises performing a post-exposure bake about a temperature ranging from about 80 degrees Celsius to about 250 degrees Celsius.

5. The method of claim 1, further comprising removing some of the patterned portions of the photosensitive layer by a dry etch process.

6. The method of claim 1, wherein etching the exposed portions of the material layer to transfer the pattern of the photolithography mask into the material layer and into the semiconductor substrate comprises:

performing a first etch process to remove exposed portions of the material layer; and performing a second etch process to remove a thickness of exposed portions of the semiconductor substrate.

7. A method of patterning a material layer on a semiconductor substrate, the method comprising:

applying a treatment that partially cross-links polymers in exposed portions of a photosensitive layer such that the exposed portions of the photosensitive layer have a cross-linking gradient between a bottom surface of the exposed portions and a top surface of the exposed portions;

developing the photosensitive layer to generate patterned portions of the photosensitive layer corresponding to the exposed portions of the photosensitive layer and to expose portions of an underlying material layer;

etching exposed portions of the material layer to transfer a pattern of the patterns portions of the photosensitive layer into the material layer; and removing at least a portion of each of the patterned portions of the photosensitive layer by a wet etch process.

8. The method of claim 7, further comprising etching exposed portions of the semiconductor substrate corresponding to the patterned portions of the photosensitive layer.

9. The method of claim 7, further comprising removing an upper portion of each of the patterned portions of the photosensitive layer by a dry etch process.

10. The method of claim 7, wherein the wet etch process is a solvent strip process.

11. A method of patterning a material layer in a semiconductor fabrication process, the method comprising:

exposing portions of a photosensitive layer to a radiation source, wherein the photosensitive layer is disposed over a material layer and wherein the portions are defined by a photolithography mask;

applying a treatment to partially cross-link the exposed portions of the photosensitive layer;

developing the photosensitive layer to generate patterned portions of the photosensitive layer corresponding to the exposed portions of the photosensitive layer;

etching the exposed portions of the material layer to transfer a pattern of the photolithography mask into the material layer; and removing at least a portion of each of the patterned portions of the photosensitive layer by a wet etch process.

12. The method of claim 11, wherein applying the treatment to partially cross-link the exposed portions of the photosensitive layer comprises performing a post-exposure bake.

13. The method of claim 12, wherein the post-exposure bake is performed at a temperature less than a temperature that would cause the photosensitive layer to fully cross-link.

14. The method of claim 11, wherein the photosensitive layer comprises a cross-linker with more than four cross-linking sites.

15. The method of claim 14, wherein the cross-linker is a bonded cross-linker.

16. The method of claim 15, wherein removing at least a portion of each of the pattern portion of the photosensitive layer by the wet etch process comprising applying a strip solvent to the patterned portions of the photosensitive layer.

17. The method of claim 16, wherein the patterned portions of the photosensitive layer have a thickness and wherein applying the strip solvent to the patterned portions of the photosensitive layer removes about 45% to about 95% of the thickness of the patterned portions, leaving a remaining thickness of the patterned portions.

18. The method of claim 17, further comprising performing a dry etch process that removes the remaining thickness of the patterned portions.

19. The method of claim 14, wherein the cross-linker is a blended cross-linker.

20. The method of claim 11, wherein the photosensitive layer is formed from a photosensitive material comprising a loading of a cross-linker from about 0.1% to about 10% equivalent loading, wherein the loading depends on a number of cross-linker sites present on the cross-linker.

* * * * *